(12) United States Patent
Narathong et al.

(10) Patent No.: US 8,618,854 B2
(45) Date of Patent: Dec. 31, 2013

(54) ADAPTIVE CLOCK SWITCHING TO CAPTURE ASYNCHRONOUS DATA WITHIN A PHASE-TO-DIGITAL CONVERTER

(75) Inventors: Chiewcharn Narathong, San Diego, CA (US); Lai Kan Leung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 240 days.

(21) Appl. No.: 12/905,859

(22) Filed: Oct. 15, 2010

(65) Prior Publication Data
US 2012/0092053 A1 Apr. 19, 2012

(51) Int. Cl.
*H03L 7/06* (2006.01)
(52) U.S. Cl.
USPC ......................................................... 327/159
(58) Field of Classification Search
None
See application file for complete search history.

(56) References Cited

U.S. PATENT DOCUMENTS

| | | | | |
|---|---|---|---|---|
| 5,475,393 A | * | 12/1995 | Heinzerling | 342/410 |
| 5,818,265 A | | 10/1998 | Meller et al. | |
| 7,145,975 B2 | * | 12/2006 | Yen et al. | 375/376 |
| 8,204,153 B2 | * | 6/2012 | Yamaguchi et al. | 375/316 |
| 2004/0027158 A1 | | 2/2004 | Schoch | |
| 2007/0096836 A1 | | 5/2007 | Lee et al. | |

FOREIGN PATENT DOCUMENTS

| | | |
|---|---|---|
| EP | 1137188 | 9/2001 |
| GB | 2267401 A | 12/1993 |

OTHER PUBLICATIONS

International Search Report and Written Opinion—PCT/US2011/056115—ISA/EPO—Mar. 5, 2012.

* cited by examiner

*Primary Examiner* — Lincoln Donovan
*Assistant Examiner* — Khareem E Almo
(74) *Attorney, Agent, or Firm* — Ramin Mobarhan

(57) ABSTRACT

A Phase-to-Digital Converter (PDC) within a Phase-Locked Loop (PLL) includes a PDC portion and a PDC decoder portion. The PDC portion receives a reference signal FR and a feedback signal FV and generates therefrom a stream of multi-bit digital values. Each multi-bit value is indicative of a time difference between an edge of FR and a corresponding edge of FV. The PDC decoder portion includes sequential logic elements that are clocked to capture the multi-bit digital values. In order to prevent metastability, the timing of when the sequential logic elements are clocked to capture the multi-bit digital values is adjusted as a function of the phase difference between FR and FV. In one specific example, if the phase difference is small then the falling edge of FR is used to clock the sequential logic elements, whereas if the phase difference is large then the rising edge of FR is used.

29 Claims, 13 Drawing Sheets

MOBILE COMMUNICATION DEVICE

PHASE-TO-DIGITAL CONVERTER

PDC OPERATION

SETUP AND HOLD
TIMES ARE SATISFIED

SETUP TIME IS
VIOLATED

HOLD TIME IS
VIOLATED

PHASE-TO-DIGITAL CONVERTER

ADAPTIVE CLOCK SIGNAL ADJUSTING CIRCUIT

GLITCH-FREE CLOCK MULTIPLEXER

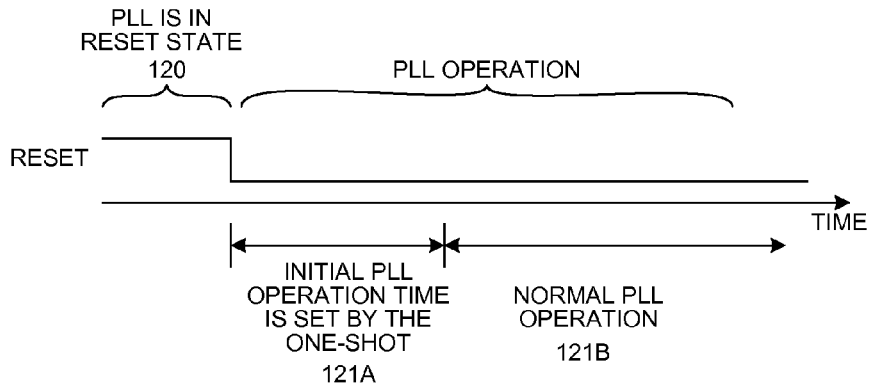

INITIAL PLL OPERATION

FIG. 10

| LUT INPUT | | | | | LUT OUTPUTS | |
|---|---|---|---|---|---|---|
| INPUT THREE BITS (LUT_IN) | nXO | FR (MHz) | SCALE (wrt 4x) | HALF CLK (us) | WIN_LOWER_BND (us) 14 BITS | WIN_UPPER_BND (us) 15 BITS |
| 000 | 0.5 | 9.6 | 8.00 | 0.0521 | 0.0521-$t_{SETUP}$ | 0.0521+$t_{HOLD}$ |
| 001 | 1.0 | 19.2 | 4.00 | 0.0260 | 0.0260-$t_{SETUP}$ | 0.0260+$t_{HOLD}$ |
| 010 | 1.5 | 28.8 | 2.67 | 0.0174 | 0.0174-$t_{SETUP}$ | 0.0174+$t_{HOLD}$ |
| 011 | 1.75 | 33.6 | 2.29 | 0.0149 | 0.0149-$t_{SETUP}$ | 0.0149+$t_{HOLD}$ |
| 100 | 2.0 | 38.4 | 2.00 | 0.0130 | 0.0130-$t_{SETUP}$ | 0.0130+$t_{HOLD}$ |
| 101 | 3.0 | 57.6 | 1.33 | 0.0087 | 0.0087-$t_{SETUP}$ | 0.0087+$t_{HOLD}$ |
| 110 | 3.5 | 67.2 | 1.14 | 0.0074 | 0.0074-$t_{SETUP}$ | 0.0074+$t_{HOLD}$ |
| 111 | 4.0 | 76.8 | 1.00 | 0.0065 | 0.0065-$t_{SETUP}$ | 0.0065+$t_{HOLD}$ |

LUT OUTPUTS WINDOW BOUND VALUES THAT ARE
APPROPRIATE FOR THE FREQUENCY OF FR

FIG. 11

USE FRB TO CLOCK COARSE_OUT INTO THE
PDC DECODER PORTION

ADAPTIVE CLOCK SWITCHING TO CAPTURE ASYNCHRONOUS DATA WITHIN A PHASE-TO-DIGITAL CONVERTER

BACKGROUND INFORMATION

1. Technical Field

The present disclosure relates to Phase-to-Digital Converters (PDCs).

2. Background Information

A Phase-Locked Loop (PLL) is a circuit that sees wide applicability in electronics. There are many different types of PLLs. One type of PLL is often referred to as a Digital PLL or a DPLL. A DPLL generally involves a control loop involving a Digitally-Controlled Oscillator (DCO). The DCO outputs a signal whose frequency is a function of a multi-bit digital tuning word on inputs of the DCO. The signal output by the DCO is divided down in frequency by a loop divider of the DPLL to generate a feedback signal. A Phase-to-Digital Converter (PDC) of the DPLL compares the phase of an incoming reference signal to the phase of the feedback signal and outputs a digital phase error word indicative of this phase difference. As the DPLL operates, the PDC outputs a stream of such phase error words. A loop filter filters the stream and outputs a corresponding stream of digital tuning words that are in turn supplied as an input signal to the DCO. When the DPLL is in lock, the DCO is controlled such that the phase of the feedback signal is locked in phase with respect to the phase of the reference signal.

This description of the DPLL is a simplification. For example, during a time before locking of the DPLL, the phase and/or frequency relationship between the reference signal and the feedback signal may be arbitrary. The phase and/or frequency relationship may also be changing in various ways. Similarly, during DPLL operation the phase relationship between the feedback signal and the reference signal may suddenly change for a variety of reasons. Such variations in the phase and frequency relationship between the reference signal and the feedback signal can be seen to disturb PDC operation in undesirable ways. An improved PDC for use in DPLLs is therefore sought.

SUMMARY

A Phase-to-Digital Converter (PDC) within a Phase-Locked Loop (PLL) includes a PDC portion and a PDC decoder portion. The PDC portion receives a reference signal FR and a feedback signal FV and generates therefrom a stream of multi-bit digital values. Each multi-bit digital value is indicative of a time difference between an edge of FR and a corresponding edge of FV. The PDC decoder portion includes sequential logic elements that are clocked to capture the multi-bit digital values. In order to prevent metastability of the sequential logic elements, the timing of when the sequential logic elements are clocked to capture the multi-bit digital values is adjusted as a function of the phase difference between FR and FV.

In one example, if the phase difference is small then the falling edge of FR is used to clock the sequential logic elements, whereas if the phase difference is large then the rising edge of FR is used to clock the sequential logic elements. In one specific example, the multi-bit digital values as output by the PDC portion are compared to a window lower bound value (WIN_LOWER_BND) and to a window upper bound value (WIN_UPPER_BND). If a multi-bit digital value is determined to be greater than the lower bound value and smaller than the upper bound value, then the determination is made that the phase difference in a window and is adequately large that the rising edge of FR should be used to clock the sequential logic elements. If, however, the determination is that the multi-bit digital value is not in the window, then the falling edge of FR is used to clock the sequential logic elements.

In another specific example, a decoded output value (PDC_DEC_OUT) as output from the PDC decoder portion is used in this in-window determination rather than using the multi-bit digital value as output by the PDC portion. The decoded output value is the value supplied to the digital loop filter of the PLL. If this decoded output value is determined to be in the window defined by the upper and lower bound values, then the rising edge of FR is used to clock the sequential logic elements, otherwise the falling edge of FR is used to clock the sequential logic elements. The timing of the clock signal supplied to the sequential logic elements can be adjusted in this way either in the same FR period during which the FR-to-FV phase determination is made, or the timing can be adjusted in a later FR period. The adjusting of timing can be accomplished by using a clock multiplexer to supply either the reference signal FR onto the clock input leads of the sequential logic elements or to supply an inverted version of FR onto the clock input leads.

Although the switching of the clock signal between FR and an inverted version of FR (denoted FRB) is one way to adjust the timing of the clocking of the sequential logic elements, there are other ways. A first signal other than an inverted version of FR can be used to clock the sequential logic elements under conditions of a small phase difference, and a second signal other than FR can be used to clock the sequential logic elements under conditions of a large phase difference. Alternatively, rather adaptively advancing or delaying the clock signal as supplied onto the clock input leads of the sequential logic elements to eliminate potential setup and hold time problems, the data supplied onto the data inputs of the sequential logic elements can be adaptively advanced or delayed to eliminate setup and hold time problems.

In one example of the PDC, the phase difference between FR and FV as recorded in a SIGN bit is used to determine which signal to use to clock the sequential logic elements during an initial operation time period of the PLL following a reset condition. Then in later normal operation time period of the PLL, the results of the in-window determination is used to control which signal to use to clock the sequential logic elements. The PDC includes a Look Up Table (LUT) that outputs a pair of window lower bound and window upper bound values, where the pair of values output is appropriate for the frequency of the reference signal FR being used. If the frequency of FR is changed during PLL operation, then this LUT changes the upper and lower bound values so that the new values are correct for the new FR frequency used. Various aspects of PDC operation are configurable by a remote processor. In one example, the processor located in a digital baseband processor integrated circuit programs the PLL in an RF transceiver integrated circuit to operate using a different reference signal frequency FR. Control information received from this processor sets the window lower and upper bound values and communicates them to the in-window comparator logic indirectly via a serial bus, a serial bus interface, and the LUT.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or methods described herein, as defined solely by the claims, will become apparent in the non-limiting detailed description set forth herein.

BRIEF DESCRIPTION OF THE DRAWINGS

FIG. 10 is a diagram that shows how the PDC operates in a first way in an initial PLL operation time period and how the PDC operates in a second way in a subsequent normal PLL operation time period.

FIG. 11 is a table that shows how the values stored in the Look Up Table (LUT) within the adaptive clock signal adjusting circuit of FIG. 8 can be determined.

DETAILED DESCRIPTION

Figure 1:
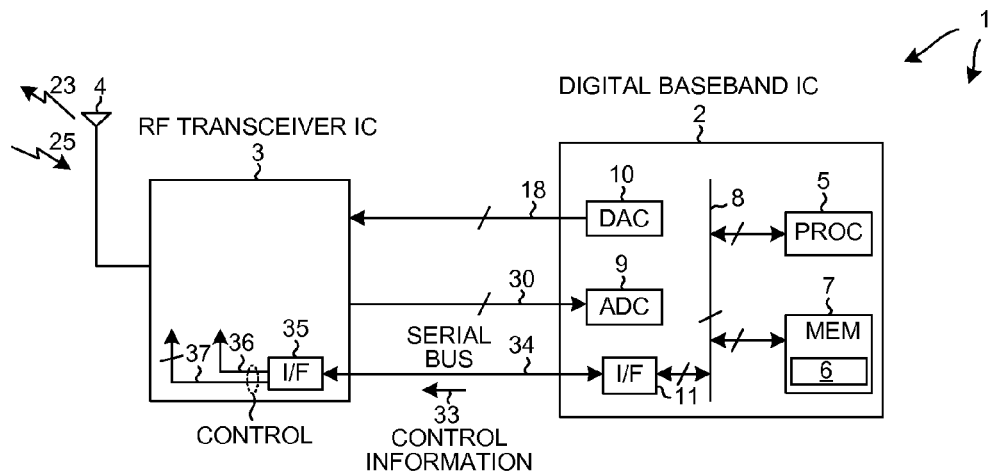
FIG. 1 is a diagram of a communication system that employs a Phase-to-Digital Converter (PDC) in accordance with one novel aspect.

FIG. 1 is a diagram of a communication system 1 that employs a Phase-to-Digital Converter (PDC) in accordance with one novel aspect. System 1 in this example is a cellular telephone handset involving (among other parts not illustrated) a digital baseband processor integrated circuit 2, an RF transceiver integrated circuit 3, and an antenna 4. Digital baseband processor integrated circuit 2 includes a digital processor 5 that executes a program 6 of processor-executable instructions. Program 6 is stored in a processor-accessible processor readable medium 7 such a semiconductor memory. Processor 6 accesses memory 7 via a bus mechanism 8. Digital baseband processor integrated circuit 2 further includes an Analog-to-Digital Converter (ADC) block 9, a Digital-to-Analog Converter (DAC) block 10, and a serial bus interface block 11.

Figure 2:
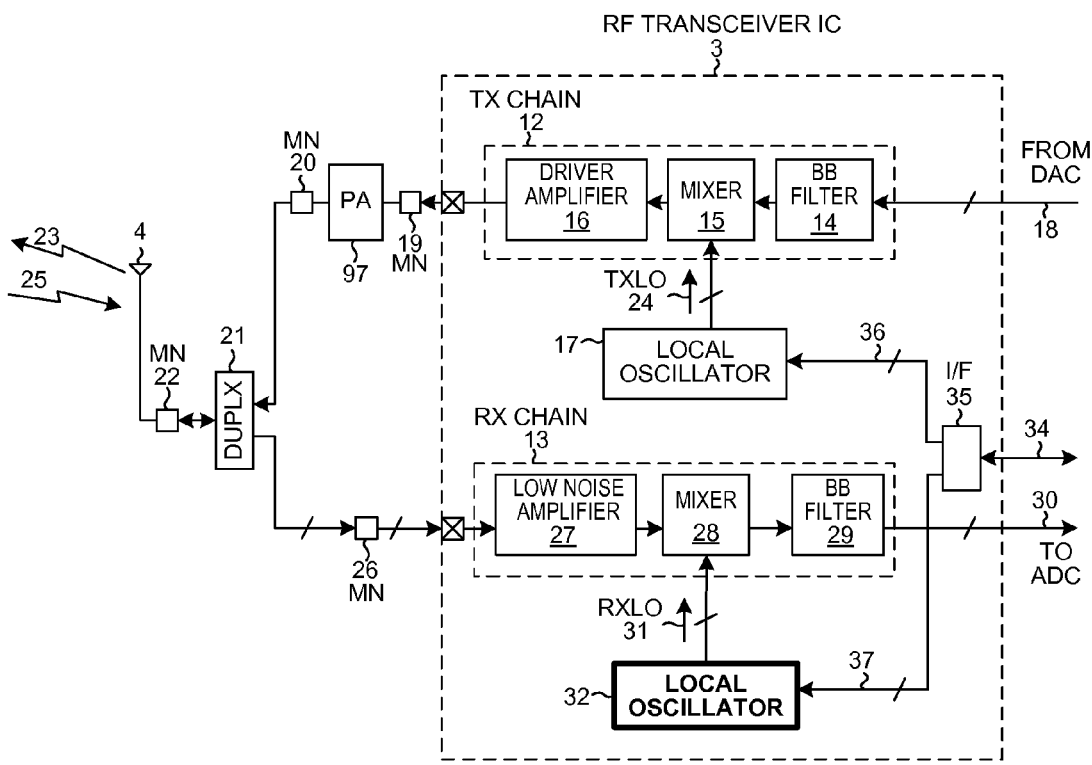
FIG. 2 is a more detailed diagram of the RF transceiver integrated circuit, the antenna, and the intervening circuitry in the communication system of FIG. 1.

FIG. 2 is a more detailed diagram of the RF transceiver integrated circuit 3, antenna 4, and intervening circuitry including a discrete power amplifier (PA) integrated circuit 97. The RF transceiver integrated circuit 3 includes a transmit chain 12 and a receive chain 13. Transmit chain 12 includes a baseband filter block 14, an upconverting mixer 15, and a driver amplifier 16. A local oscillator circuit 17 (also referred to as a frequency synthesizer) supplies a local oscillator signal (TXLO) 24 to mixer 15.

If the cellular telephone 1 is being used to transmit information as part of a cellular telephone conversation, then a baseband signal is generated in digital baseband processor integrated circuit 2. After being converted into analog form by DAC block 10, the resulting signal is supplied across conductors 18 to baseband filter block 14. The filtered output of baseband filter block 14 is upconverted by mixer 15 and is amplified by driver amplifier 16 and is output from the RF transceiver integrated circuit 3. The RF signal passes through matching network 19, and is further amplified by RF power amplifier (PA) 97. The resulting amplified signal passes through matching network 20 and duplexer 21 and matching network 22 and is driven out onto antenna 4 and is transmitted from device 1 as outgoing transmission 23. The transmitter is tuned by controlling the frequency of the local oscillator signal TXLO 24.

If the cellular telephone is being used to receive information as part of a cellular telephone conversation, then an incoming transmission 25 is received on antenna 4. The incoming signal passes through matching network 22, duplexer 21, a matching network 26, and into the RF transceiver integrated circuit 3. The incoming signal is amplified by Low Noise Amplifier (LNA) 27 that is part of receive chain 13. After being downconverted in frequency by a mixer 28 and after being filtered by baseband filter 29, the information is communicated across conductors 30 to the digital baseband processor integrated circuit 2 for analog-to-digital conversion and further processing in the digital domain. How the receive chain downconverts is controlled by changing the frequency of a local oscillator signal RXLO 31 generated by local oscillator 32.

The local oscillators 17 and 32 of the transmit and receive chains are controlled by control information 33 received via bus interface 11, serial bus 34, bus interface 35, and control conductors 36 and 37. The control information is generated by processor 5 executing the program 6 of processor-executable instructions.

Figure 3:
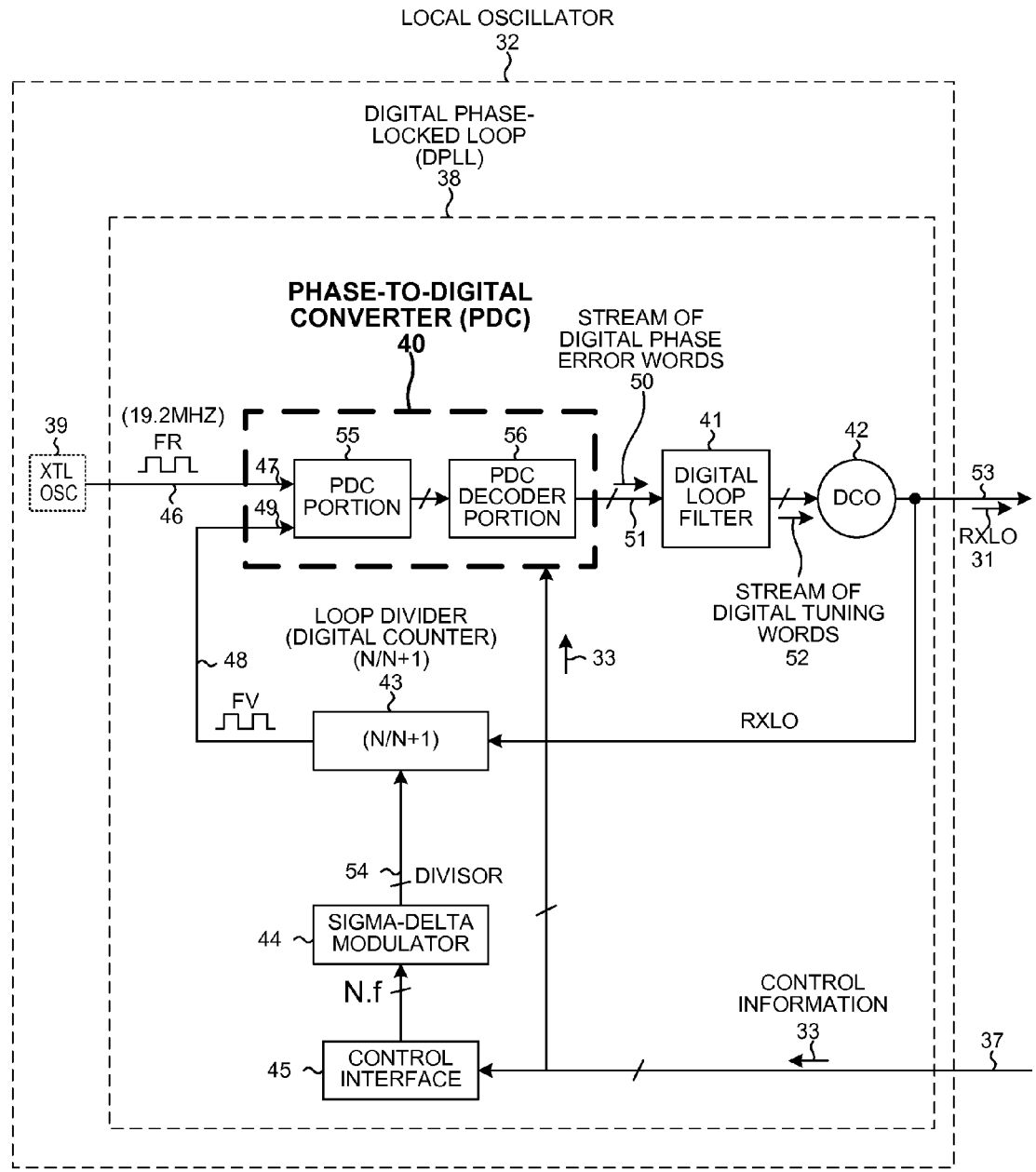
FIG. 3 is a more detailed diagram of one of the local oscillators in the RF transceiver integrated circuit of FIG. 2.

FIG. 3 is a more detailed diagram of local oscillator 32 of FIG. 2. Local oscillator 32 includes a fractional N Digital Phase-Locked Loop (DPLL) 38 and a source 39 of a reference signal FR. Source 39 may be a crystal oscillator, or a portion of an oscillator, or another source of the reference signal FR such as one or more conductors through which the reference signal FR is communicated. DPLL 38 includes a Phase-to-Digital Converter (PDC) 42, a digital loop filter 41, a Digitally-Controlled Oscillator (DCO) 42, a loop divider 43, a sigma-delta modulator 44, and a control interface 45.

The reference signal FR is supplied via conductor 46 onto a first input lead 47 of PDC 40. PDC 42 receives a feedback signal FV from conductor 48 via second input lead 49. PDC 40 determines a phase relationship between corresponding edges of the reference signal FR and the feedback signal FV and supplies a corresponding stream of digital phase error words 50 via conductors 51 to digital loop filter 41. In one example, each digital phase error word is a multi-bit digital value whose magnitude is proportional to the detected phase difference between a rising edge of FR and a corresponding rising edge of FV. Digital loop filter 41 filters the stream of digital phase error words 50 and supplies a stream digital tuning words 52 to DCO 42. At a given time, the digital tuning word received by DCO 42 determines the frequency of the local oscillator output signal RXLO 31 that is output by DCO 42 onto conductor 53. The DCO 42 may, for example, be implemented in the form of an eleven-bit Digital-to-Analog Converter (DAC) followed by an analog Voltage Controlled Oscillator (VCO). The local oscillator output signal RXLO is in this example an RF/analog signal in the 4 GHz range. The RXLO signal may be divided down in frequency by another divider (not shown) at the location of the mixer. The output signal RXLO can be single-ended or differential. Loop divider 43 frequency divides the single-bit local oscillator output signal RXLO by a multi-bit digital divisor value received from sigma-delta modulator 44 via conductors 54, and outputs the resulting divided-down single-bit feedback signal FV onto conductor 48. The loop divider can be dual-modulus or multi-modulus. Sigma-delta modulator 44 changes the divisor value back and forth from an integer value N to the next integer N+1 over time such that over time the frequency of RXLO is divided by the fractional F value N.f. The "N" in the fractional F value "N.f" represents an integer, whereas the ".f" in the fractional value "N.f" represents a fractional value. Digital baseband processor integrated circuit 2 controls and sets the N.f value by sending appropriate control information 33 to the control interface 45 via conductors 37.

Figure 4:
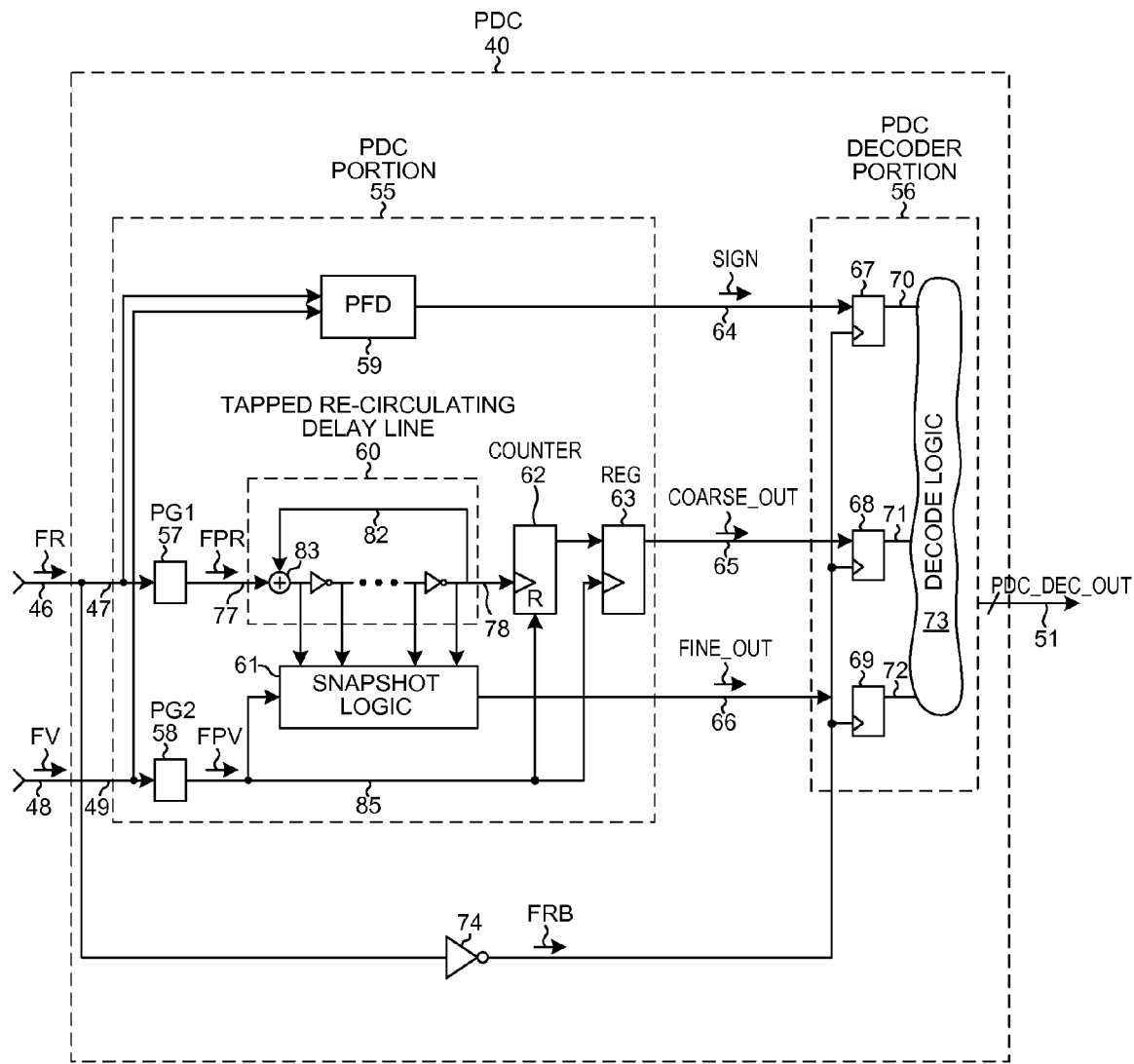
FIG. 4 is a more detailed diagram of a PDC within the local oscillator of FIG. 3

FIG. 4 is a more detailed diagram of PDC 40 of FIG. 3. PDC 40 includes a PDC portion 55 and a PDC decoder portion 56. PDC portion 55 includes a first pulse generator (PG1) 57, a second pulse generator (PG2) 58, a Phase-Frequency Detector (PFD) 59, a tapped re-circulating delay line 60, snapshot logic 61, a counter 62, and an output register 63. PFD 59 detects whether the reference signal FR leads the feedback signal FV in phase or whether the reference signal FR lags the feedback signal FV in phase. PFD 59 asserts its single-bit output signal SIGN to be a digital high if the reference signal FR leads the feedback signal FV in phase. Signal SIGN on conductor 64 is a digital low if the reference signal FR lags the feedback signal FV in phase. The multi-bit digital value COARSE_OUT on conductors 65 and the multi-bit digital value FINE_OUT on conductors 66 together indicate the degree to which FR and FV are out of phase with respect to one another. Each COARSE_OUT value is a five-bit value. Each FINE_OUT value is a ninety-six bit value.

After the SIGN, COARSE_OUT and FINE_OUT values are determined for a FR edge versus a FV edge, these values are all clocked at the same time into a plurality of sequential logic elements 67, 68 and 69 of the PDC decoder portion 56. In this example, sequential logic element 67 is a single flip-flop, sequential logic elements 68 is a five-bit register of flip-flops, and sequential logic elements 69 is a ninety-six bit register of flip-flops. The registered outputs of the sequential logic elements 67, 68 and 69 on corresponding conductors 70, 71 and 72 constitute a registered version of the multi-bit digital value SIGN, COARSE_OUT, FINE_OUT on conductors 64, 65 and 66. Each such registered multi-bit digital value is decoded by combinatorial decode logic 73 to generate a corresponding digital phase error word PDC_DEC_OUT. PDC_DEC_OUT is one of the phase error words of the stream of phase error words 50 of FIG. 3. The PDC_DEC_OUT phase error word is supplied via conductors 51 to digital loop filter 41. The reference signal FR is inverted by digital logic inverter 74 to generate digital logic signal FRB. The rising edge of signal FRB is used to clock the SIGN, COARSE_OUT and FINE_OUT values into the corresponding sequential logic elements 67, 68 and 69. As PDC 40 operates, each successive pair of FR and FV edges results in a multi-bit digital value involving a SIGN bit, a COARSE_OUT value and a FINE_OUT value. The PDC portion 55 therefore outputs a stream of these multi-bit values. The sequential logic elements 67-69 in turn output a registered stream of these values. One registered value is output by the sequential logic elements once for each successive pair of FR and FV values. The registered stream of multi-bit values as output by the sequential logic elements is decoded to generate a corresponding stream of PDC_DEC_OUT phase error words.

Figure 5:
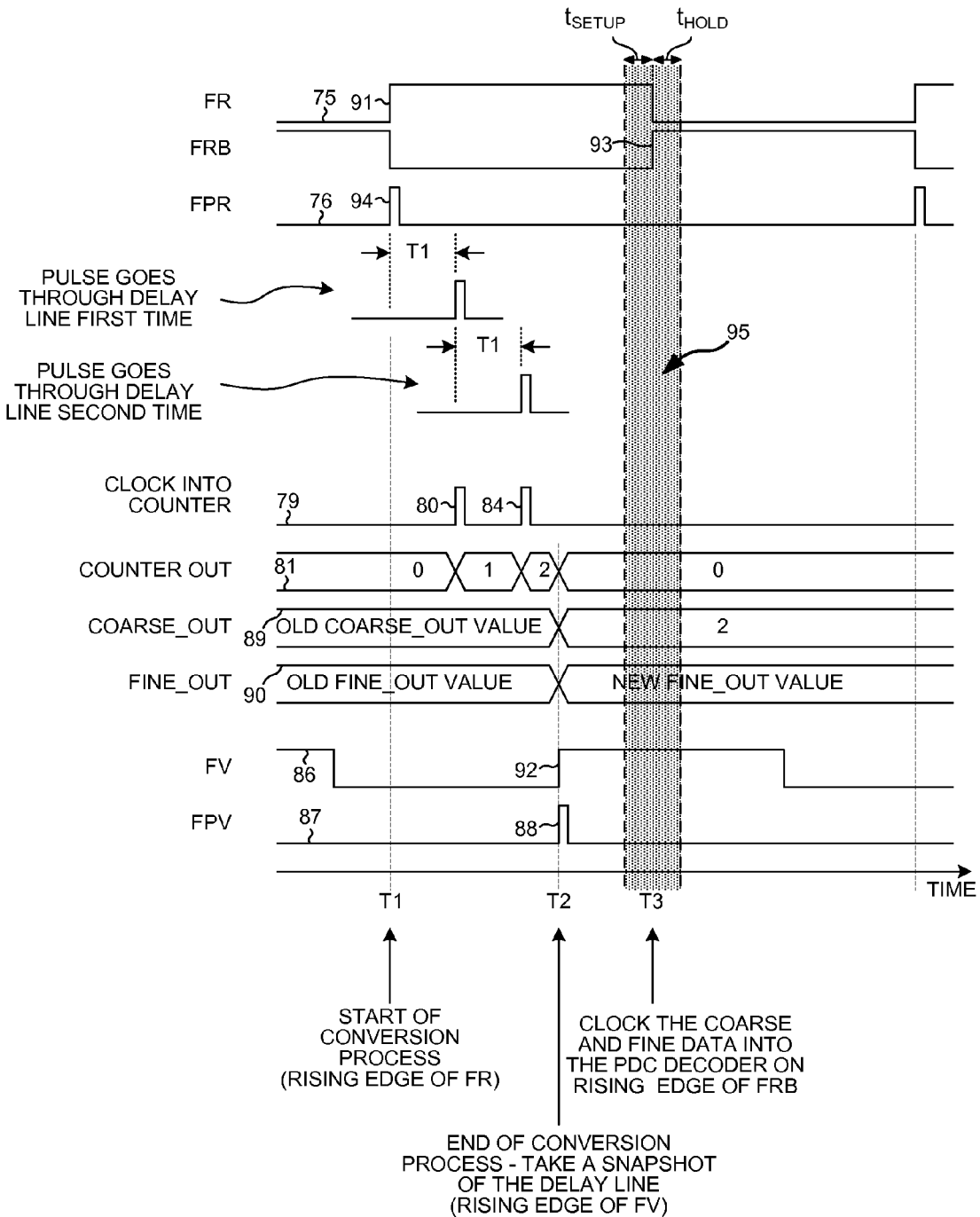
FIG. 5 is a waveform diagram that illustrates an operation of the PDC of FIG. 4.

FIG. 5 is a waveform diagram that illustrates how PDC portion 55 generates a pair of COARSE_OUT and FINE_OUT values. In the waveform diagram, time extends from left to right. The upper waveform 75 labeled FR is a waveform of the incoming reference signal FR. Pulse generator GP1 57 generates a signal FPR having pulses at the times of the rising edges of FR. Waveform 76 labeled FPR shows this signal. As a result of the first rising edge 91 of FR at time T1, a first pulse 94 of FPR is supplied onto the input lead 77 of the tapped re-circulating delay line 60. After a propagation delay time T1, the pulse appears on the output lead 78 of the delay line 60 and clocks counter 62. As a result, counter 62 increments. Waveform 79 labeled CLOCK INTO COUNTER shows this pulse 80 that causes counter 62 to increment from an output count value of zero to an output count value of one. Although a different reference numeral 80 is used to identify this pulse, it is not a different pulse from pulse 94 of the FPR signal but rather is a delayed version of pulse 94 that appears on the clock input lead of counter 62. Waveform 81 labeled COUNTER OUT shows this incrementing of the counter. The pulse on the clock input lead of the counter is also, however, fed back (re-circulated) within the delay line 60 via conductor 82 to loop multiplexer 83. Loop multiplexer 83 introduces the pulse back onto the input of the delay line so it can pass through the delay line a second time. After a second propagation delay time T1, the pulse appears for a second time on output lead 78 of the delay line 60 and clocks counter 62 a second time. Counter 62 increments from an output count value of one to an output count value of two. This pulse that clocks the counter the second time is identified by reference numeral 84 in waveform 79. This process continues, with counter 62 being incremented once each time the pulse completes a pass through the delay line 60. When the rising edge 92 the feedback signal FV occurs, then pulse generator PG2 58 outputs a pulse 88 onto conductor 85. Waveform 86 represents the feedback signal FV. Waveform 87 shows the pulse signal FPV as output by second pulse generator PG2 58 onto conductor 85. This pulse 88 causes the output count value from counter 62 to be clocked into register 63 and simultaneously causes counter 62 to be reset. Waveform 89 labeled COARSE_OUT shows the output count value of "2" from the counter appearing as the new COARSE_OUT value at the time of the FPV pulse. At the same time, the output counter value shown in COUNTER OUT waveform 81 is reset to zero.

In addition to causing register 63 to capture the output counter value and in addition to resetting counter 62, the FPV pulse 88 causes snapshot logic 61 to capture the state of all the taps of the delay line. This state is represented by the multi-bit digital value FINE_OUT. FINE_OUT is a ninety-six bit thermometer code that is output by snapshot logic 61 onto conductors 66. The FINE_OUT value records how far down the delay line 60 the pulse got in its last attempt to pass through the delay line before the FPV pulse 88 occurred. Waveform 90 shows the FINE_OUT value changing from the old FINE_OUT value to the new FINE_OUT value at the time T2 of FPV pulse 88. The COARSE_OUT value is a coarse indicator of the time delay between the rising edge 91 of FR and the corresponding rising edge 92 of FV because it indicates the number of complete times the pulse was able to propagate through the delay line 60. The FINE_OUT value is a fine indicator of the time delay between the rising edge 91 of FR and the corresponding rising edge 92 of FV because it indicates the fractional part of how far down the delay line the pulse was able to go the last time before the rising edge of FV occurred. Once the SIGN, COARSE_OUT and FINE_OUT values have been determined in this way, then the rising edge 93 at time T3 causes these values to be clocked into the sequential logic elements 67, 68 and 69.

A problem with this circuit sometimes, however, occurs in that the setup time or the hold time of one or more of the sequential logic elements 67, 68 and 69 can be violated in certain circumstances. The setup time, denoted $t_{SETUP}$, is a time before the rising edge of FRB by which the data on the data input leads of the sequential logic elements should be stable at legal and unchanging values so that the data is properly "setup" for being clocked into the sequential logic elements. The hold time, denoted $t_{HOLD}$, is a time after the rising edge of FRB until which the data on the data input leads of the sequential logic elements should be "held" fixed and stable at the legal and unchanging values so that the data just clocked into the sequential logic elements is not disturbed. The setup and hold times together define a band of time around the time about the rising edge of the FRB signal. The data is to be stable and unchanging during this defined band of time. The vertical band 95 shown in shading in FIG. 5 represents this defined band of time. Unfortunately, if the phase difference between feedback signal FV and reference signal FR is great enough, then the SIGN, COARSE_OUT and/or FINE_OUT values may be changing too close to the time T3 when the rising edge 93 of FRB is to clock the data into the sequential logic elements. Metastability of the sequential logic elements may result. This is a problem that may be intermittent and difficult to detect.

Figure 6A:
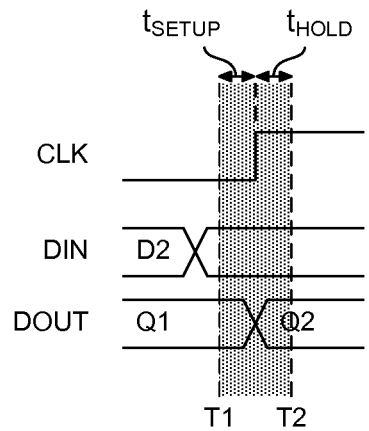
FIG. 6A is a waveform diagram that illustrates a situation in which the setup and hold times of a flip-flop are satisfied.
Figure 6B:
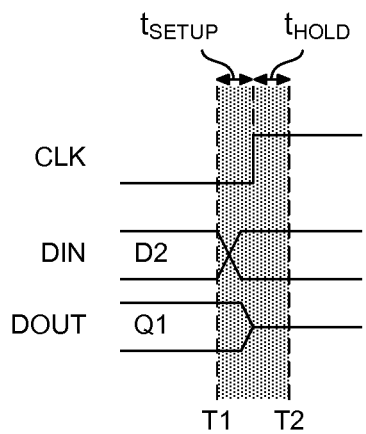
FIG. 6B is a waveform diagram that illustrates a situation in which the setup time of the flip-flop is violated.
Figure 6C:
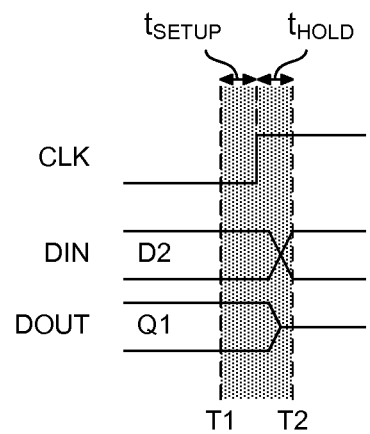
FIG. 6C is a waveform diagram that illustrates a situation in which the hold time of the flip-flop is violated

FIG. 6A is a waveform diagram that illustrates a condition of the setup and hold times of a flip-flop being satisfied. The data DIN being clocked into the flip-flop is setup and stable from time T1 until time T2. FIG. 6B is a waveform diagram that illustrates a condition in which the setup time of the flip-flop is violated. The data DIN being clocked into the flip-flop changes slightly after time T1. FIG. 6C is a waveform diagram that illustrates a condition in which the hold time of the flip-flop is violated. The data DIN being clocked into the flip-flop changes slightly before time T2.

Figure 7:
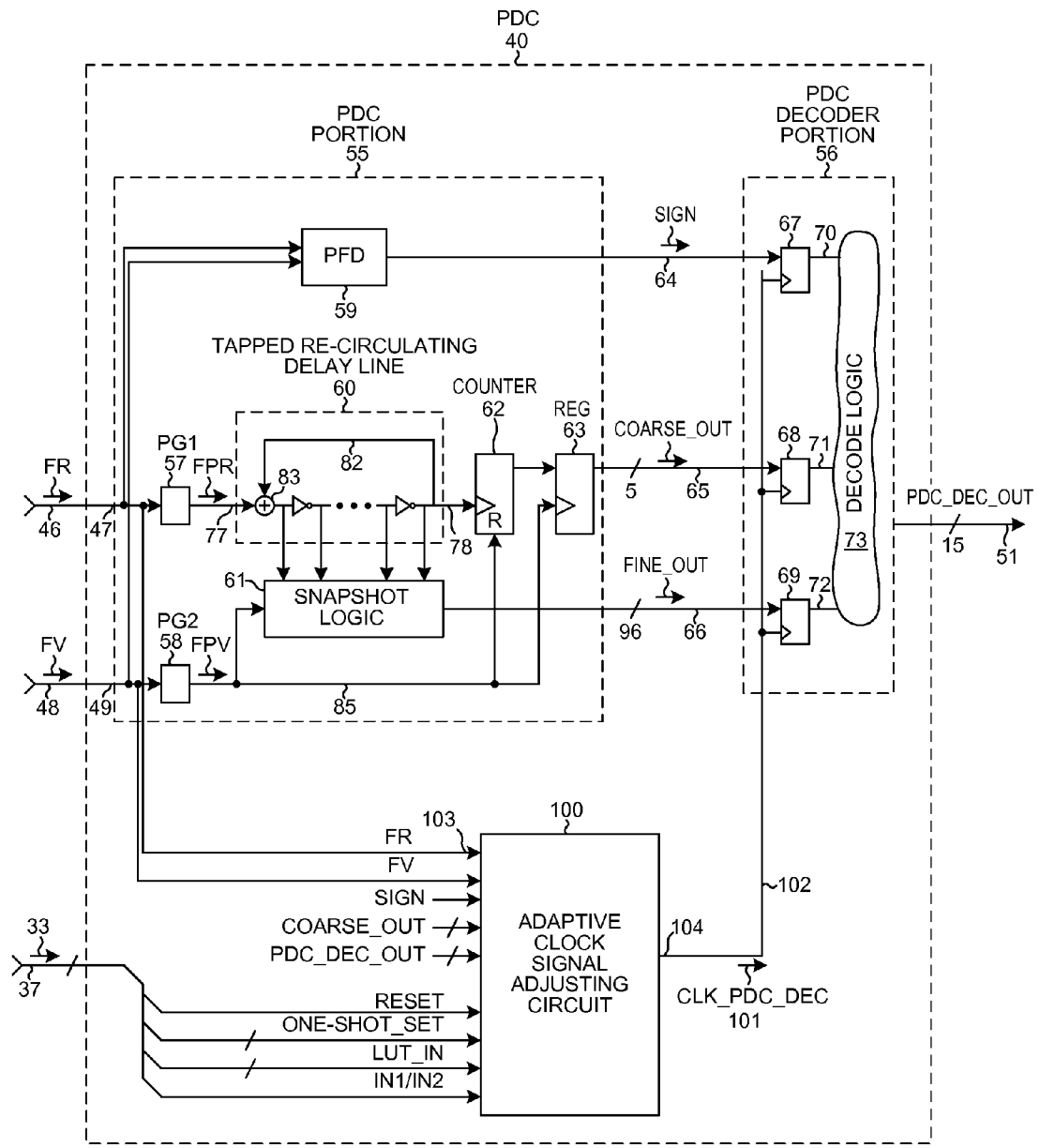
FIG. 7 is a circuit diagram of the PDC in the local oscillator of FIG. 3 in accordance with one novel aspect.

FIG. 7 is a diagram of PDC 40 in accordance with one novel aspect. PDC portion 55 and PDC decoder portion 56 are of the same construction as the example described above in connection with FIG. 4. Rather than the PDC of FIG. 7 using inverter 74 to clock the sequential logic elements 67, 68 and 69 on the rising edges of FRB, there is no inverter 74 in the PDC of FIG. 7 but rather an adaptive clock signal adjusting circuit 100 is provided. Adaptive clock signal adjusting circuit 100 receives the signals and values FR, FV, SIGN, COARSE_OUT and PDC_DEC_OUT and from these signals and values adjusts the timing of when the sequential logic elements 67, 68 and 69 are clocked. The timing is adjusted as a function of the phase difference between FR and FV such that the SIGN, COARSE_OUT and FINE_OUT values are clocked into their corresponding sequential logic elements at a time that does not violate the setup times of the sequential logic elements or the hold times of the sequential logic elements. In one example, if the phase delay between FR and FV is relatively small, then SIGN, COARSE_OUT and FINE_OUT will be determined and stable and output by PDC portion 55 adequately soon before the rising edge of FRB. If FR is a 50/50 duty cycle signal, then the rising edge of FRB occurs about midway through the period of the reference signal FR. Under this condition, the rising edge of FRB is used to clock the SIGN, COARSE_OUT and FINE-OUT values into the sequential logic elements. If, on the other hand, the phase delay between FR and FV is relatively large, then the clocking of SIGN, COARSE_OUT and FINE_OUT into the sequential logic elements is delayed by using the rising edge of FR to clock the sequential logic elements. The value COARSE_OUT is valid at the time of the rising edge of the feedback signal FV so this COARSE_OUT value is usable by the adaptive clock signal adjusting circuit (in one mode) to determine whether the phase delay between FR and FV is relatively small (COARSE_OUT is small) such that the rising edge of FRB should be used to clock the sequential logic elements or whether the phase delay between FR and FV is relatively large (COARSE_OUT is large) such that the rising edge of FR should be used to clock the sequential logic elements.

The signal CLK_PDC_DEC 101 that is supplied onto the clock input leads of the sequential logic elements via conductor 102 is the clock signal supplied by the adaptive clock signal adjusting circuit 100. In one example, the adaptive clock signal adjusting circuit 100 includes a clock multiplexer. If the clocking of the sequential logic elements is to occur relatively late in the FR period then the clock multiplexer is controlled to couple the FR signal as received on input lead 103 onto output lead 104 and conductor 102, whereas if the clocking of the sequential logic elements is to occur relatively early in the FR period then the clock multiplexer is controlled to couple an inverted version of the FR signal onto output lead 104 and conductor 102.

Figure 8:
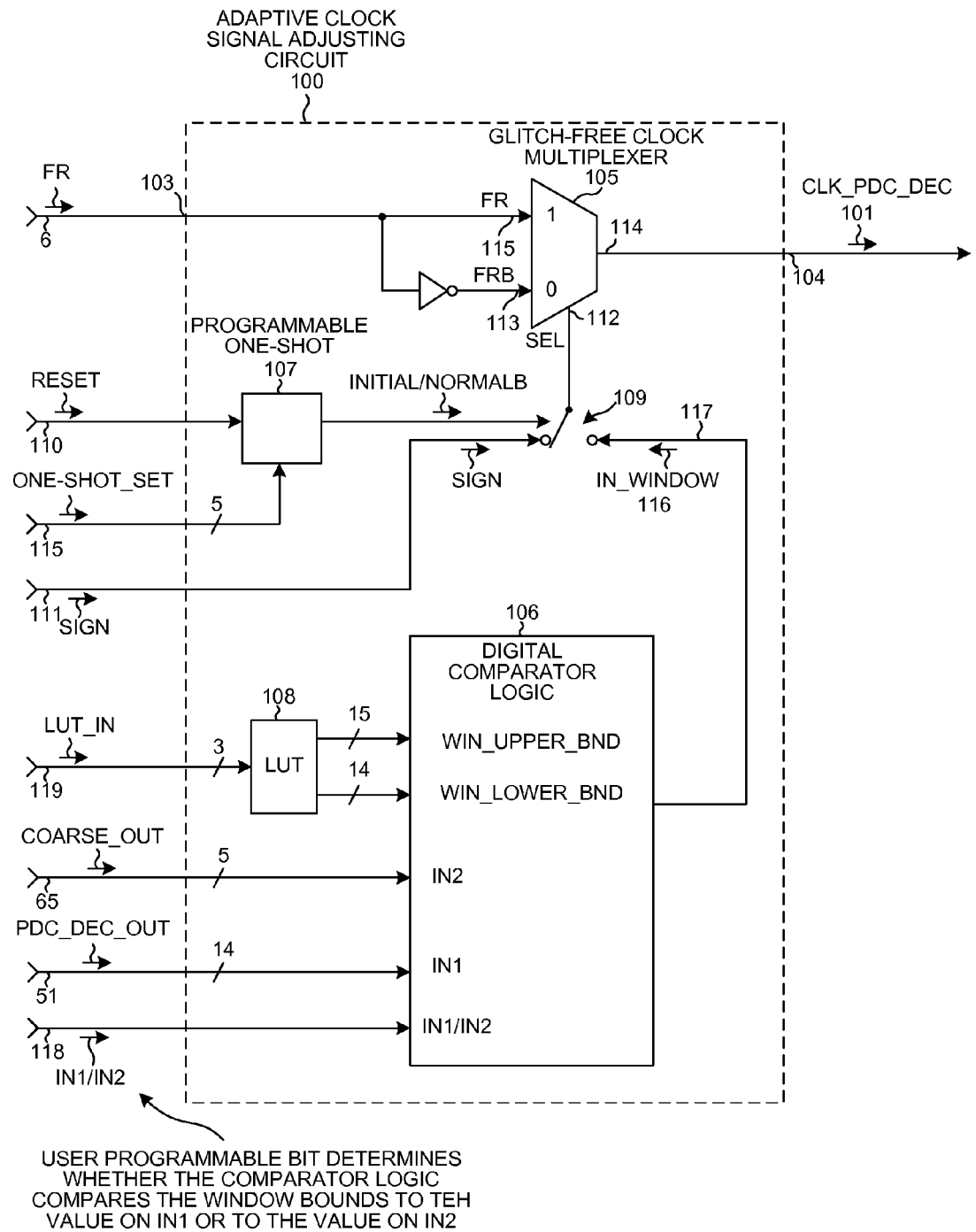
FIG. 8 is a more detailed circuit diagram of the adaptive clock signal adjusting circuit within the PDC of FIG. 7.

FIG. 8 is a more detailed diagram of one example of the adaptive clock signal adjusting circuit 100 of FIG. 7. Adaptive clock signal adjusting circuit 100 includes a glitch-free clock multiplexer 105, digital comparator logic 106, a programmable one-shot 107, a Look Up Table (LUT) 108, and a switching circuit 109. The adaptive clock signal adjusting circuit 100 is operable in an initial condition following a reset, and in a normal operating condition. Programmable one-shot 107 receives a reset signal RESET on conductor 110. When RESET is asserted high, the programmable one-shot is reset and holds its output signal INITIAL/NORMALB at a digital high value. This indicates the reset condition and causes switching circuit 109 to couple the SIGN signal from conductor 111 onto the select input lead 112 of the glitch-free clock multiplexer 105. If the SIGN bit has a digital high value indicating that FR leads FV in phase, then the clock multiplexer couples the FRB signal on its "0" data input lead 113 to its output lead 114 so that FRB will clock the sequential logic elements. If, however, the SIGN bit has a digital low value indicating that FR lags FV in phase, then the clock multiplexer couples the FR signal on its "1" data input lead 115 to its output lead 114 so that FR will clock the sequential logic elements.

Following the time when the RESET signal transitions low (the end of the reset period), the programmable one-shot 107 continues to assert INITIAL/NORMALB high for a period of time determined by the five-bit value ONE-SHOT_SET on conductors 115. When this initial time defined by the value ONE-SHOT_SET expires, then programmable one-shot 107 forces INITIAL/NORMALB to a low value. This causes the switching circuit 109 to couple a signal IN_WINDOW 116 from conductor 117 onto the select input lead 112 of the clock multiplexer 105. The signal IN_WINDOW 116 is generated by the digital comparator logic 106. The signal IN1/IN2 on conductor 118 is a programmable one-bit value tells the digital comparator logic 106 whether it should compare the PDC_DEC_OUT value on its IN1 input leads to the window or whether it should compare the COARSE_OUT value on its IN2 input leads to the window.

The PDC_DEC_OUT value is a fourteen-bit value that allows the phase determination to be made with more resolution and accuracy than the five-bit COARSE_OUT value. The ninety-six bits of the FINE_OUT value are encoded by the PDC decoder portion 56 along with the coarse information, and all this information is included in the fourteen-bit PDC_DEC_OUT value. Using the PDC_DEC_OUT value in controlling the clock multiplexer involves using a phase difference determination from a prior FR period to determine how to control the clock multiplexer 105 in a following FR period. This latency is generally acceptable because the phase difference between FR and FV generally does not change suddenly. If the IN1/IN2 election is made to use COARSE_OUT to make the phase determination, then the in-window determination is made with less accuracy but the phase difference determination being used to control the clock multiplexer 105 is for the same FR period (i.e., the phase difference determination is made early in the FR period and this determination is used to control how the clock multiplexer is switched later in the same FR period).

Operation of the adaptive clock signal adjusting circuit 100 of FIG. 8 is described in a situation in which IN1/IN2 has a digital logic high value. The five-bit COARSE_OUT value from conductors 65 is therefore used in the in-window determination. If the COARSE_OUT value is greater than the WIN_LOWER_BND value from LUT 108 and if the COARSE_OUT value is also smaller than the WIN_UPPER_BND value from LUT 108, then the IN_WINDOW signal 116 is asserted high. If, on the other hand, the COARSE_OUT value is determined not to be in the window defined by WIN_LOWER_BND and WIN_UPPER_BND, then IN_WINDOW signal 116 is asserted low. The values WIN_LOWER_BND and WIN_UPPER_BND are in units of the amount of time required for a signal to propagate through delay line 60. Note that the WIN_LOWER_BND and WIN_UPPER_BND values differ depending on the frequency of FR. A three-bit value LUT_IN received via conductors 119 is used as an index into the LUT to select the pair of values appropriate for the frequency of the signal FR being used.

The conductors 110, 115, 119 and 118 via which digital comparator logic 106 receives the signals RESET, ONE-SHOT_SET, LUT_IN and IN1/IN2 are some of the conductors 37 (see FIG. 3) that extend from the serial bus interface 35. The signals RESET, ONE-SHOT_SET, LUT_IN and IN1/IN2 constitute some of the control information 33 (see FIG. 3). Accordingly, these signals RESET, ONE-SHOT_SET, LUT_IN and IN1/IN2 are programmable under the control of the processor 5 of the digital baseband processor integrated circuit 2. Processor 5 can change these values by sending different control information 33 across the serial bus 34 to the RF transceiver integrated circuit 3 such that this control information 33 passes through serial bus interface 35 and across conductors 37 to the PDC 40.

Figure 9:
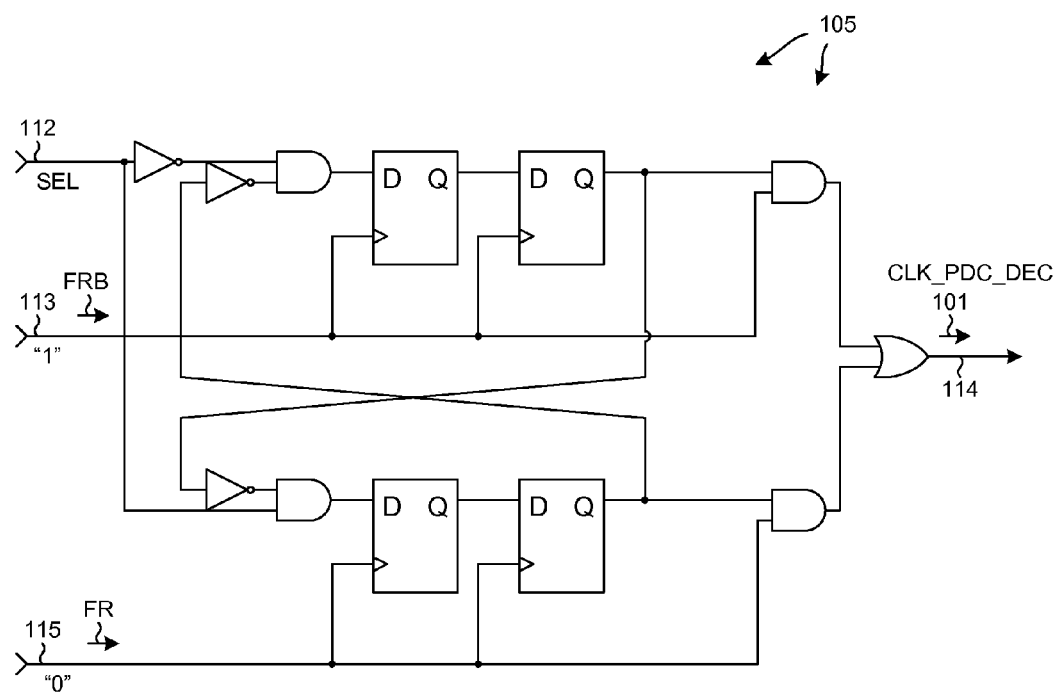
FIG. 9 is a diagram of one example of the clock multiplexer in the adaptive clock signal adjusting circuit of FIG. 8.

FIG. 9 is a more detailed circuit diagram of the glitch-free clock multiplexer 105 of FIG. 8.

FIG. 10 is a diagram of a timeline that illustrates an initial time period 120 when the RESET signal from conductor 110 is at a digital logic high. The SIGN signal is supplied onto the select input lead 112 of the clock multiplexer 105. The PLL is not operational during this time. The time period 121A is the initial time period following a transitioning of the RESET signal from high to low. This is the time period 121A defined by the five-bit value ONE-SHOT_SET. The SIGN signal continues to be supplied onto the select input lead 112 of the clock multiplexer 105. The time period 121B is the time of normal PLL operation after the programmable one-shot 107 has asserted INITIAL/NORMALB to a digital logic low level. During this time it is the result of the in-window determination made by digital comparator logic 106 that controls the clock multiplexer 105. The IN_WINDOW signal 116 is supplied onto the select input lead 112 of the clock multiplexer 105.

FIG. 11 is a diagram that illustrates operation of LUT 108. The column labeled WIN_LOWER_BND sets forth how the fourteen-bit LUT output values WIN_LOWER_BND may be determined The value $t_{SETUP}$ is dependent upon the particular sequential logic elements used. The values in this column are in units of time. The values correspond to one half the period of the FR signal minus the $t_{SETUP}$ time. A given one of these times is then divided by the amount of time required to pass through delay line 60 so that the result will be in units of propagation delays through delay line 60. The result is a fourteen-bit value that is stored into the LUT 108. Each row in the table corresponds to a different FR frequency. Similarly, the rightmost column labeled WIN_UPPER_BND sets forth how the fifteen-bit LUT output values WIN_UPPER_BND may be determined for the particular process and type of sequential logic elements used. The values in this column are in units of time. The values correspond to one half of the period of the FR signal plus the $t_{HOLD}$ time. These time numbers are converted into units of propagation delays through delay line 60 and the resulting numbers are stored in the LUT. The leftmost column of the table sets forth the three bit LUT_IN input value that is used to select the appropriate pair of WIN_LOWER_BND and WIN_UPPER_BND values for FR frequency being used.

At least one of WIN_LOWER_BND and WIN_UPPER_BND is programmed via serial bus interface 35 depending on whether COARSE_OUT or PDC_DEC-OUT is being used. LUT 108 then scales WIN_LOWER_BND and WIN_UPPER_BND according to FR. If PDC_DEC_OUT is used (IN1 is selected), then the window bound time values of FIG. 11 should be divided by the amount of time for each unit inverter inside the delay line, rather than being divided by the amount of time required to pass through the entire delay line.

Figure 12:
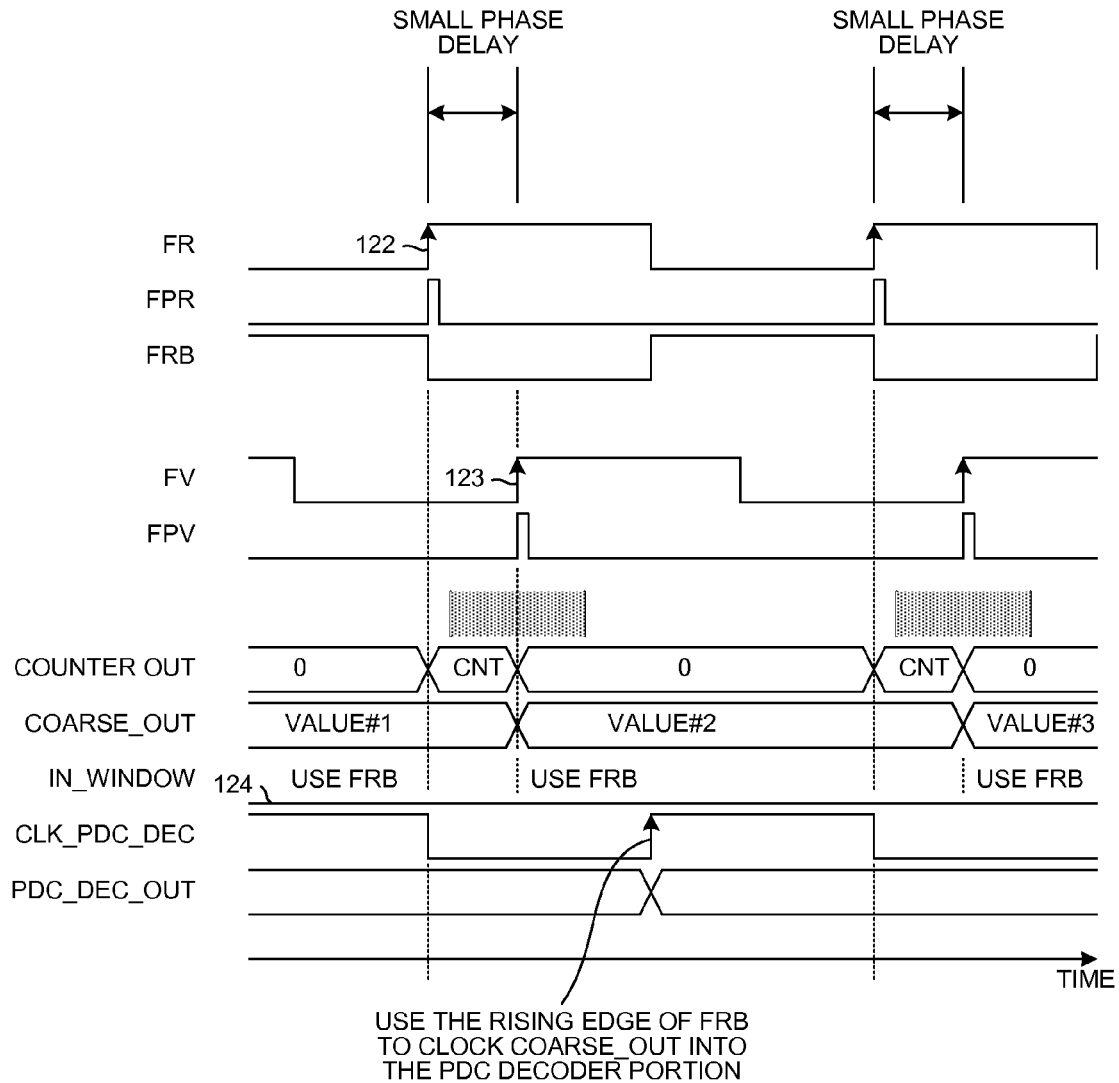
FIG. 12 is a waveform diagram that shows operation of the PDC of FIG. 7 in a situation in which the phase difference between the reference signal FR and the feedback signal FV is relatively small.

FIG. 12 is a waveform diagram that illustrates operation of the PDC 40 of FIG. 7 in a condition in which the phase difference between FR and FV is relatively small. The counter 62 counts from the time of the rising edge 122 of FR to the rising edge 123 of FV. Because this time is relatively small, the counter output value is relatively small at the time FV transitions high. COARSE_OUT is therefore relatively small. The adaptive clock signal adjusting circuit 100 determines that COARSE_OUT is not in the window. The signal IN_WINDOW is therefore a digital low. Waveform 124 labeled IN_WINDOW in FIG. 12 is at a digital logic low level throughout the time period illustrated in FIG. 12. Accordingly, clock multiplexer 105 is controlled to supply FRB to clock the sequential logic elements. In the case of a very small phase delay, if FR were used to clock the sequential logic elements, then hold time violations may occur because the data being clocked (SIGN, COARSE_OUT or FINE_OUT) may be made to change for the next conversion cycle (the next FR period) too soon after the clocking at the rising edge of FR at the end of the prior conversion cycle (the current FR period). Accordingly, for small phase delay situations, the FRB signal is used to clock the sequential logic elements midway through the current FR period.

Figure 13:
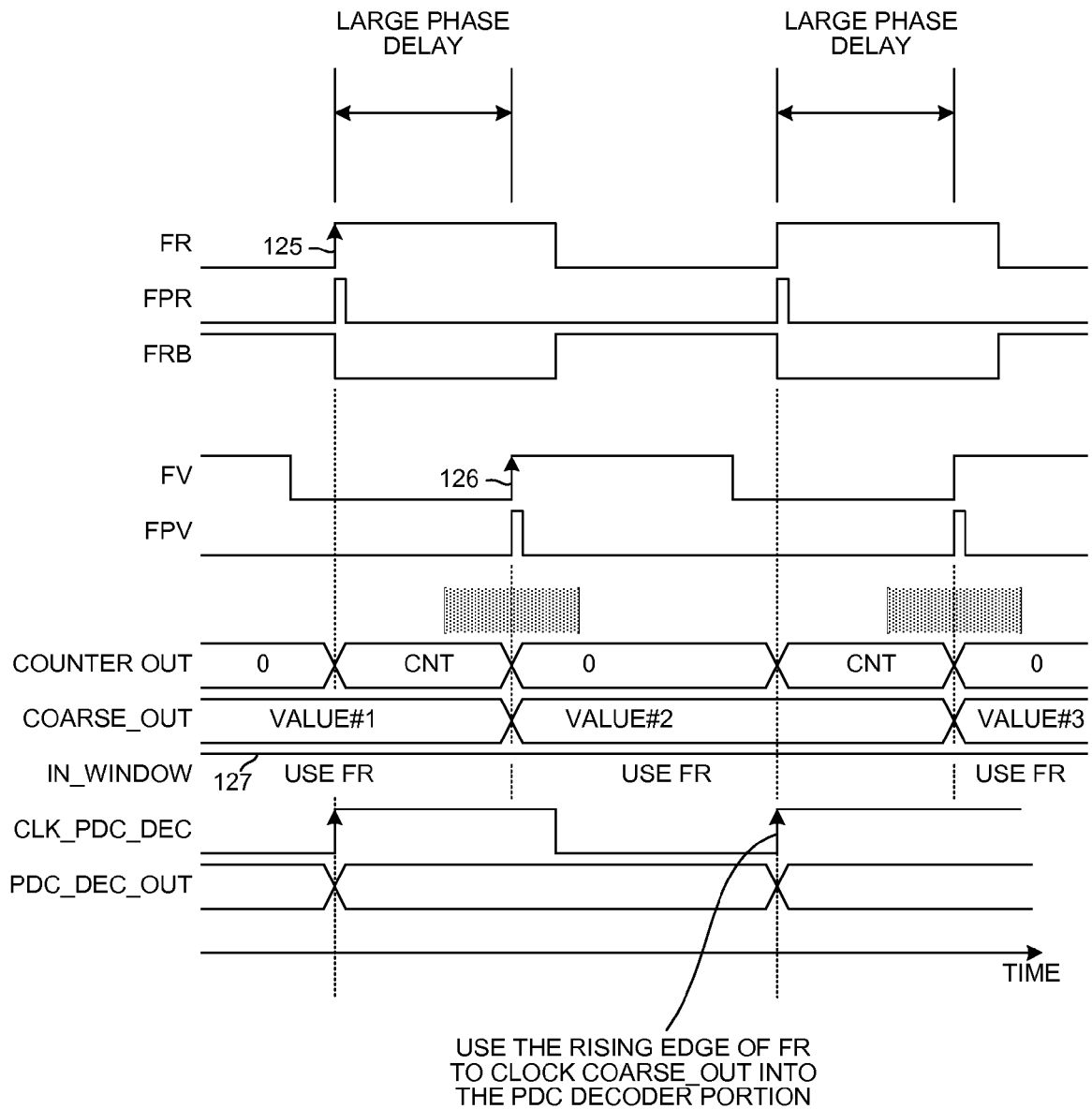
FIG. 13 is a waveform diagram that shows operation of the PDC of FIG. 7 in a situation in which the phase difference between the reference signal FR and the feedback signal FV is relatively large.

FIG. 13 is a waveform diagram that illustrates operation of the PDC 40 of FIG. 7 in a condition in which the phase difference between FR and FV is relatively large. The counter 62 counts from the time of the rising edge 125 of FR to the rising edge 126 of FV. Because this time is relatively large, the counter output value is relatively large at the time FV transitions high. COARSE_OUT is therefore relatively large. The adaptive clock signal adjusting circuit 100 determines that COARSE_OUT is in the window. The signal IN_WINDOW is therefore a digital high. Waveform 127 labeled IN_WINDOW in FIG. 13 is at a digital logic high level throughout the time period illustrated in FIG. 13. Accordingly, clock multiplexer 105 is controlled to supply FR to clock the sequential logic elements.

Figure 14:
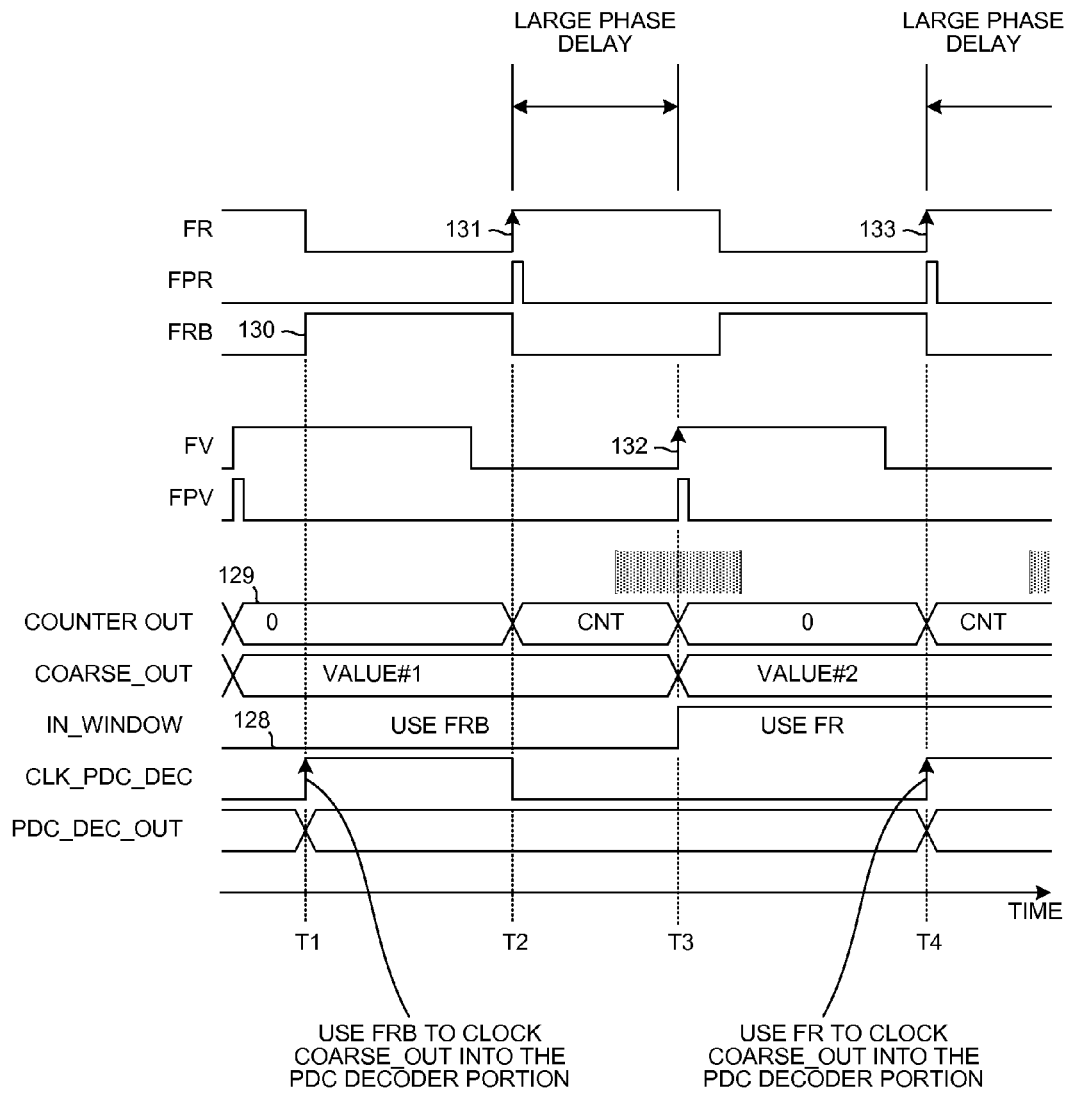
FIG. 14 is a waveform diagram that shows operation of the PDC of FIG. 7 in a situation in which the phase difference between the reference signal FR and the feedback signal FV is initially relatively small and then changes to be relatively large.

FIG. 14 is a waveform diagram that illustrates operation of the PDC 40 of FIG. 7 in a condition in which the phase difference between FR and FV is initially relatively small and then becomes relatively large. Due to a small phase difference between a pair of FR and FV rising edges that occur prior to the period of time illustrated in FIG. 14, the value IN_WINDOW is low at the left of the diagram. The value of the IN_WINDOW waveform 128 is at a digital logic low level. The pulse of FPV at the rising edge of FV at the end of this prior conversion cycle leaves the counter cleared as indicated by waveform 129. The rising edge 130 of FRB at time T1 clocks the sequential logic elements. Then at time T2, the rising edge 131 of FR initiates a new conversion cycle. This causes the counter to begin counting as described above. The notation "CNT" in waveform 129 indicates this counting. Then at time T3 the rising edge 132 of feedback signal FV causes the output of counter 62 to be captured in register 63, causes counter 62 to be cleared, and causes a FINE_OUT snap shot to be taken. At this time the digital comparator logic 106 within the adaptive clock signal adjusting circuit 100 compares the COARSE_OUT value to the WIN_LOWER_BND and WIN_UPPER_BND values determines that COARSE_OUT is in the window. The IN_WINDOW signal is therefore asserted at time T3. This causes the clock multiplexer 105 to switch from using FRB to clock the sequential logic elements to using FR to clock the sequential logic elements. The sequential logic elements are clocked by the rising edge 133 of FR at time T4. Accordingly, it is seen that during each edge phase comparison cycle the adaptive clock signal adjusting circuit 100 makes a determination of the time delay between the FR and FV rising edges and based on that determination either causes FRB to be used to clock the sequential logic elements or causes FR to be used to clock the sequential logic element. Which of the two signals is used to clock the sequential logic elements is a function of the COARSE_OUT value and the phase difference between FR and FV.

The waveform diagrams of FIGS. 12, 13 and 14 presented above and the corresponding textual description involve simplifications made in order to make illustrating and explaining circuit operation more clear. In the actual circuit, if the glitch-free clock multiplexer 105 of FIG. 9 is employed, then the clock signal used to clock the sequential logic element is not changed right away in the same FR period during which the in-window determination is made but rather the switching of the clock signal occurs several clock cycles later. It is to be understood that different clock multiplexer circuits can be used, and that the particular glitch-free clock multiplexer circuit of FIG. 9 is presented here only as an example. For an understanding of the accurate and detailed circuit operation, the PDC circuit can be manufactured and tested and/or the PDC circuit can be simulated using a logic or circuit simulator.

Figure 15:
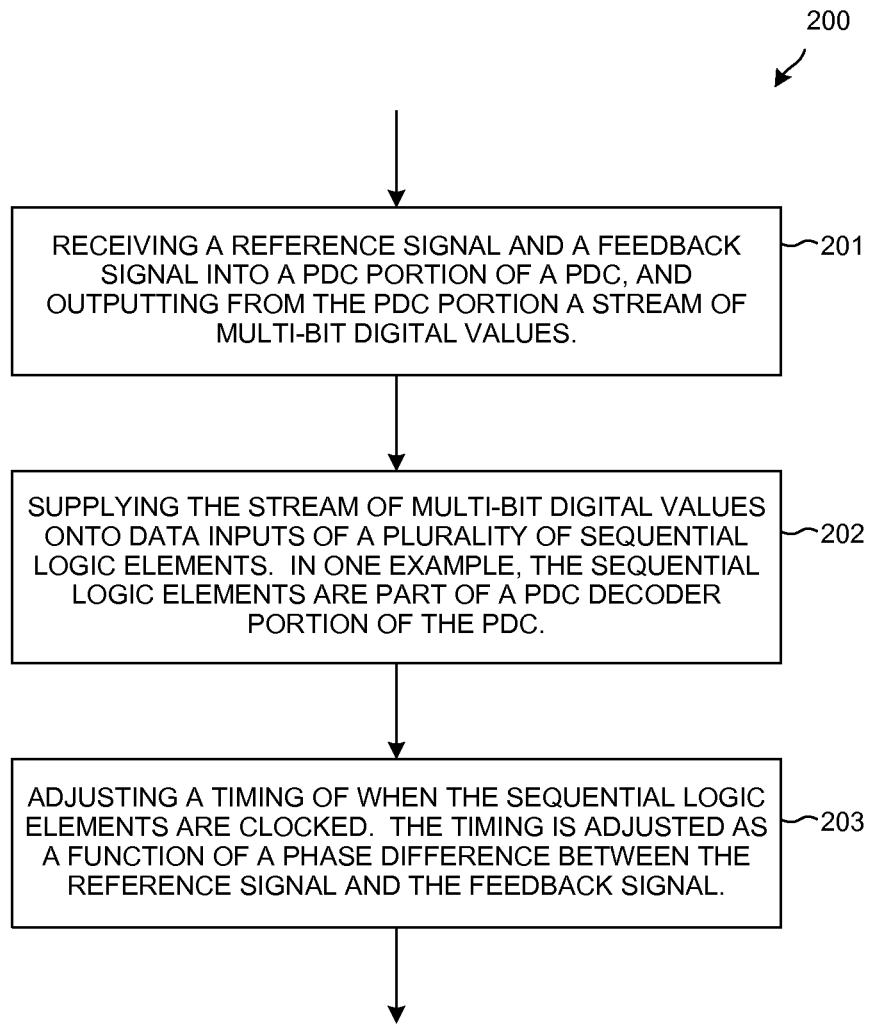
FIG. 15 is a flowchart of a method 200 in accordance with one novel aspect.

FIG. 15 is a flowchart of a method 200 in accordance with one novel aspect. A reference signal and a feedback signal are received into a Phase-to-Digital Converter (PDC) portion of a PDC (step 201) so that the PDC portion outputs a first stream of multi-bit digital values. In one example, the PDC portion is PDC portion 55 of FIG. 7. The first multi-bit digital values are supplied (step 202) onto the data input leads of a corresponding plurality of sequential logic elements. In one example, the sequential logic elements are parts of a PDC decoder portion 56 of the PDC. A timing of when the plurality of sequential logic elements is clocked is then adjusted (step 203) as a function of a phase difference between the reference signal and the feedback signal. In one example, a determination is made as to whether the COARSE_OUT value is in a predetermined window, and if the COARSE_OUT value is determined to be in that window then the reference signal is used to clock the sequential logic elements, otherwise an inverted version of the reference signal is used to clock the sequential logic elements. In another example, the same determination is made except that the PDC_DEC_OUT value as output by the PDC decoder portion 56 is used rather than the COARSE_OUT value as output by the PDC portion 55. In some examples of the method 200 of FIG. 15, the resulting adjusting of the timing of the clocking of the sequential logic elements occurs in the same reference signal period in which the in-window determination was made, and in other examples the resulting adjusting of the timing occurs in a later period of the reference signal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, storage medium 7 is a memory in the digital baseband processor integrated circuit 2. Program 6 is a set of processor-executable instructions that are readable and executable by processor 5 of the digital baseband processor integrated circuit 2. Execution of this program 6 by processor 5 causes PDC 40 to be reconfigured when the PLL 38. An example of when the PDC 40 is reconfigured is when the PLL switches from operating using one reference signal frequency to using another reference signal frequency.

Although certain specific embodiments are described above for instructional purposes, the teachings of this patent document have general applicability and are not limited to the specific embodiments described above. The PDC employing adaptive clock switching sees use in applications outside the field of PLLs. The PDC employing adaptive clock switching can be employed in a transmitter local oscillator to generate TXLO as well as in a receiver as set forth in the description above. In one example, two windows are defined, and there are two sets of sequential logic elements, where each set is clocked by a different signal. In such a case, each of the two data inputs of the clock multiplexer has a bit width of two, where one of the bits of each data input is associated with one set of sequential logic elements and where the other of the bits of each data input is associated with the other set of sequential logic elements. Although an example is set forth above in which the clock multiplexer supplies a selected one of two signals onto the clock input of a sequential logic element, the clock multiplexer can multiplex a selected one of more than two signals onto the clock input of a sequential logic element. The clock multiplexer can, for example, multiplex one of three different signals onto the clock inputs of a set of sequential logic elements. The select input of the clock multiplexer in this case has a bit width of more than one. The determination of whether to use one signal or another to clock the sequential logic elements need not be entirely based on phase, but rather may also involve other considerations and variables in some embodiments of the PDC. Accordingly, various modifications, adaptations, and combinations of the various features of the described specific embodiments can be practiced without departing from the scope of the claims that are set forth below.

What is claimed is:

1. A method comprising:
   receiving a reference signal and a feedback signal into a Phase-to-Digital Converter (PDC) portion of a PDC and outputting from the PDC portion a first stream of multi-bit digital values;
   supplying the first stream of multi-bit digital values onto data inputs of a plurality of sequential logic elements; and
   adjusting a timing of a signal that clocks the plurality of sequential logic elements, wherein the timing is adjusted as a function of a phase difference between the reference signal and the feedback signal.

2. The method of claim 1, further comprising:
   outputting a second stream of multi-bit digital values from the plurality of sequential logic elements and supplying the second stream of multi-bit digital values to decoding circuitry.

3. The method of claim 2, wherein the plurality of sequential logic elements and the decoding circuitry are parts of a PDC decoder portion of the PDC.

4. The method of claim 1, wherein the reference signal includes a plurality of edges, wherein the feedback signal includes a plurality of edges, and wherein each of the multi-bit digital values of the first stream is indicative of a time difference between one of the edges of the reference signal and a corresponding one of the edges of the feedback signal.

5. The method of claim 1, wherein the timing is adjusted by clocking the plurality of sequential logic elements with a selected one of a plurality of signals.

6. The method of claim 1, wherein the timing is adjusted by clocking the plurality of sequential logic elements with a first signal if a multi-bit digital value of the first stream is in a predetermined window, and by clocking the plurality of sequential logic elements with a second signal if the multi-bit digital value of the first stream is outside the predetermined window.

7. The method of claim 1, wherein each of the multi-bit digital values of the first stream includes a first portion and a second portion, wherein the first portion is indicative of a number of times that a counter within the PDC portion was clocked, and wherein the second portion is a sign bit.

8. The method of claim 1, wherein the reference signal is received onto a pulse generator, and wherein a pulse signal output of the pulse generator is supplied to a tapped re-circulating delay line, and wherein a pulse signal output from the tapped re-circulating delay line is supplied to a counter, wherein the pulse generator, the tapped re-circulating delay line, and the counter are parts of the PDC portion of the PDC.

9. The method of claim 1, further comprising:
   changing the function by changing a multi-bit digital control value supplied to the PDC.

10. The method of claim 1, wherein the adjusting involves determining when an edge of a clock signal occurs with respect to an edge of the reference signal, wherein the determining is based at least in part on a magnitude of a time difference between the edge of the reference signal and a corresponding edge of the feedback signal.

11. An apparatus comprising:
    a Phase-to-Digital Converter (PDC) portion that receives a reference signal and a feedback signal and generates therefrom a stream of multi-bit digital values, wherein each of the multi-bit digital values is indicative of a time difference between an edge of the reference signal and a corresponding edge of the feedback signal;
    a PDC decoder portion that includes a plurality of sequential logic elements, wherein the PDC portion supplies the stream of multi-bit digital values onto data inputs of the plurality of sequential logic elements of the PDC decoder portion; and
    an adaptive clock signal adjusting circuit that supplies a clock signal to the plurality of sequential logic elements and adjusts timing of the clock signal that clocks the plurality of sequential logic elements as a function of the time difference between the reference signal and the feedback signal, wherein the PDC portion, the PDC decoder portion and the adaptive clock signal adjusting circuit are parts of a Phase-to-Digital Converter (PDC).

12. The apparatus of claim 11, wherein the adaptive clock signal adjusting circuit receives the stream of multi-bit digital values.

13. The apparatus of claim 11, wherein the adaptive clock signal adjusting circuit adjusts a timing of when the plurality of sequential logic elements is clocked with respect to an edge of the reference signal, wherein the adaptive clock signal adjusting circuit adjusts the timing as a function of a phase difference between the reference signal and the feedback signal.

14. The apparatus of claim 11, wherein the adaptive clock signal adjusting circuit adjusts a timing of when the plurality of sequential logic elements is clocked with respect to an edge of the reference signal, wherein the adaptive clock signal adjusting circuit adjusts the timing as a function of a time difference between the edge of the reference signal and a corresponding edge of the feedback signal.

15. The apparatus of claim 11, wherein the adaptive clock signal adjusting circuit includes a clock multiplexer, wherein the clock multiplexer has a first data input lead, a second data input lead, a select input lead, and an output lead, wherein clock signal that is supplied to the plurality of sequential logic elements is output by the clock multiplexer via the output lead.

16. The apparatus of claim 15, wherein the adaptive clock signal adjusting circuit further includes digital comparator logic, wherein the digital comparator logic is coupled to supply a control signal onto the select input lead of the clock multiplexer.

17. The apparatus of claim 16, wherein the digital comparator logic receives the stream of multi-bit digital values.

18. The apparatus of claim 11, wherein the adaptive clock signal adjusting circuit determines whether each of the multi-bit digital values is in a predetermined window.

19. The apparatus of claim 18, wherein the predetermined window is programmable.

20. The apparatus of claim 11, wherein the adaptive clock signal adjusting circuit receives a stream of multi-bit digital values from the PDC decoder portion.

21. The apparatus of claim 11, wherein the adaptive clock signal adjusting circuit receives a stream of multi-bit digital values from the PDC decoder portion, and wherein the adaptive clock signal adjusting circuit determines whether each of the multi-bit digital values received from the PDC decoder portion is in a predetermined window.

22. An apparatus comprising:
  a Phase-to-Digital Converter (PDC) portion that receives a reference signal and a feedback signal and generates therefrom a stream of multi-bit digital values;
  a Phase-to-Digital Converter (PDC) decoder portion, wherein the PDC decoder portion includes a plurality of sequential logic elements that receives the stream of multi-bit digital values from the PDC portion; and
  means for adjusting timing of a clock signal that clocks the plurality of sequential logic elements as a function of a difference between the reference signal and the feedback signal.

23. The apparatus of claim 22, wherein the difference is a phase difference.

24. The apparatus of claim 22, wherein the difference is a time difference between an edge of the reference signal and a corresponding edge of the feedback signal.

25. The apparatus of claim 22, wherein the means includes a clock multiplexer that supplies a clock signal to the plurality of sequential logic elements.

26. The apparatus of claim 25, wherein the means is also for controlling the clock multiplexer based at least in part on a determination of whether one of the multi-bit digital values generated by the PDC portion is in a predetermined window.

27. The apparatus of claim 26, wherein the predetermined window is programmable.

28. The apparatus of claim 25, wherein the PDC decoder portion outputs a second stream of multi-bit values, and wherein the means is also for controlling the clock multiplexer based at least in part on a determination of whether one of the multi-bit values of the second stream is in a predetermined window.

29. The apparatus of claim 22, wherein the apparatus is a Phase-to-Digital Converter (PDC), and wherein the PDC is a part of a Phase-Locked Loop (PLL).

* * * * *